US011749346B2

(12) United States Patent
Iwasaki et al.

(10) Patent No.: US 11,749,346 B2
(45) Date of Patent: Sep. 5, 2023

(54) OVERWRITE MODE IN MEMORY PROGRAMMING OPERATIONS

(71) Applicant: Micron Technology, Inc., Boise, ID (US)

(72) Inventors: Tomoko Ogura Iwasaki, San Jose, CA (US); Kulachet Tanpairoj, Santa Clara, CA (US); Jianmin Huang, San Carlos, CA (US); Lawrence Celso Miranda, San Jose, CA (US); Sheyang Ning, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 17/324,538

(22) Filed: May 19, 2021

(65) Prior Publication Data

US 2022/0375525 A1    Nov. 24, 2022

(51) Int. Cl.
*G11C 16/04* (2006.01)
*G11C 16/10* (2006.01)
*G11C 16/34* (2006.01)
*G11C 11/56* (2006.01)

(52) U.S. Cl.
CPC .......... *G11C 16/10* (2013.01); *G11C 16/3459* (2013.01); *G11C 11/56* (2013.01); *G11C 16/0483* (2013.01)

(58) Field of Classification Search
USPC .................................................... 365/185.12
See application file for complete search history.

(56) References Cited

U.S. PATENT DOCUMENTS 7,239,557 B2 *  7/2007  Ha ..................... G11C 16/3404
                                                                365/185.17
10,978,165 B2 *  4/2021  Nishikawa ......... G11C 16/0483

* cited by examiner

*Primary Examiner* — Tha-O H Bui
(74) *Attorney, Agent, or Firm* — Lowenstein Sandler LLP

(57) ABSTRACT

Described are systems and methods for performing memory programming operations in the overwrite mode. An example memory device includes: a memory array comprising a plurality of memory cells electrically coupled to a plurality of wordlines and a plurality of bitlines; and a controller coupled to the memory array, the controller to perform operations comprising: responsive to identifying a first data item to be stored by a portion of the memory array, causing a first memory programming operation to be performed to program, to a first target threshold voltage, a set of memory cells included by the portion of the memory array; and responsive to identifying a second data item to be stored by the portion of the memory array, causing a second memory programming operation to be performed to program the set of memory cells to a second target threshold voltage exceeding the first target threshold voltage.

17 Claims, 11 Drawing Sheets

OVERWRITE MODE IN MEMORY PROGRAMMING OPERATIONS

TECHNICAL FIELD

Embodiments of the disclosure relate generally to memory sub-systems, and more specifically, to implementing overwrite mode in memory programming operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
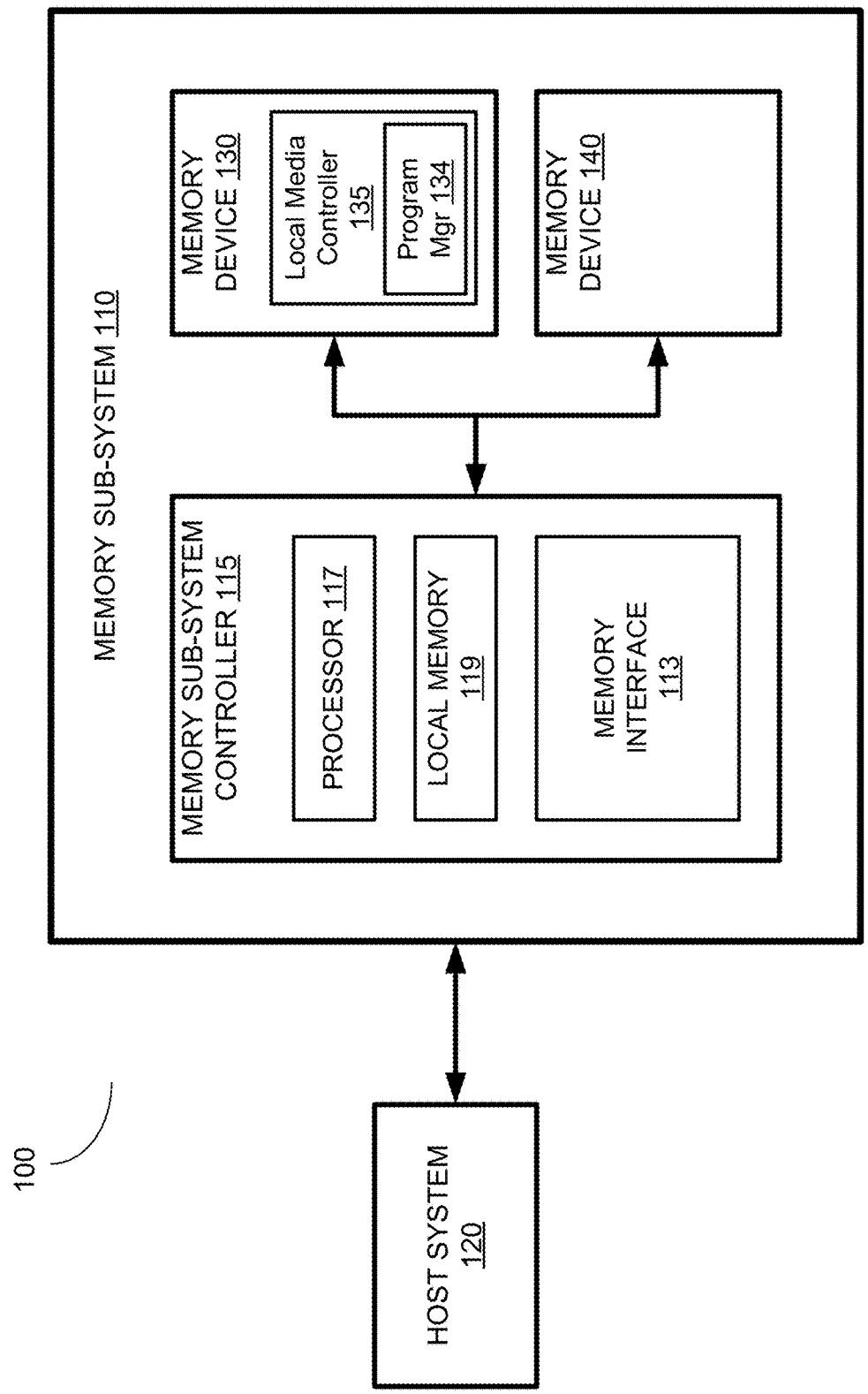
FIG. 1 illustrates an example computing system that includes a memory sub-system in accordance with some embodiments of the present disclosure.

Aspects of the present disclosure are directed to implementing overwrite mode in memory programming operations. One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

A memory cell programming operation, which can be performed in response to receiving a write command from the host, can involve sequentially applying programming voltage pulses to a selected wordline. In some implementations, the programming pulse voltage can be sequentially ramped up from the initial voltage value (e.g., 0V) to the final voltage value (e.g., $V_{MAX}$). The unselected wordlines can, during the programming operation, be biased at a certain voltage, e.g., a pass voltage, which is less than the programming voltage.

In an illustrative example, a series of high-amplitude pulses of voltage levels having an increasing magnitude (e.g., by a predefined pulse step) are applied to the wordlines connected to one or more memory cells are connected to gradually raise the voltage level to the target program level. The series of incrementing voltage programming pulses are applied to the selected wordline to increase the charge level, and thereby the threshold voltage, of the memory cells connected to that wordline. After each programming pulse, or after a number of programming pulses, a program verify operation can be performed to determine if the threshold voltage of the one or more memory cells has increased to a desired programming level.

In various conventional implementations, before a new value can be stored in a previously programmed memory cell, the memory cell should be erased by removing all charge from the memory cell. Furthermore, for many types of memory devices, the latency of erase operations exceeds the latency of write operations.

Implementations of the present disclosure address the above-referenced and other deficiencies of various common techniques by performing sequential programming operations without intervening erase operations on a memory device. In an illustrative example, each subsequent programming operation can charge the selected memory cells to a higher threshold voltage value, thus creating a new threshold voltage distribution around a higher threshold voltage value, without performing an intervening erase operation with respect to the previously created threshold voltage distribution. Such programming operations can be repeated several times in response to receiving a series of programming commands with respect to the same location of the memory device, as long as the storage media and the electric circuitry of the memory device would accommodate the increasing threshold voltage levels, before an erase operation would need be performed to remove all charge from the affected memory cells, as described in more detail herein below.

Various programming techniques can be employed to implement the above-described direct overwrite operations. For example, a programming operation may involve selectively inhibiting bitlines based on the charge level of the corresponding memory cells, while applying one or more programing pulses to the selected wordline, as described in more detail herein below.

While the examples described herein involve single level cell (SLC) programming, in various other implementations, similar techniques can be implemented for programming n memory cells to store two or more bits per cell.

Thus, advantages of this approach include, but are not limited to, improving the efficiency of memory write operations by eliminating at least some intervening erase operations, thus significantly reducing the latency or programming operations while also reducing the frequency of media management operations.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page.

In various embodiments, the memory array can include multiple portions, including, e.g., one or more portions where the sub-blocks are configured as SLC memory and/or one or more portions where the sub-blocks are configured as multi-level cell (MLC) memory (i.e., including memory cells that can store two or more bits of information per cell, e.g., TLC cells). The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In an illustrative example, program manager 134 can receive data to be programmed to the memory device 130. In response, program manager 134 can perform a programming operation to program each memory cell to a desired programming level. In another illustrative example, program manager 134 can sequentially receive several data items to be programmed to the same location of the memory device 130. In one embodiment, program manager 134 can sequentially perform programming operations to store the received data items at the specified location without intervening erase operations on the memory device. In an illustrative example, each subsequent programming operation can charge the selected memory cells to a higher threshold voltage value, thus creating a new threshold voltage distribution around a higher threshold voltage value, without performing an intervening erase operation with respect to the previously created threshold voltage distribution. Such programming operations can be repeated several times in response to receiving a series of data items to be stored at the same location of the memory device, as long as the storage media and the electric circuitry of the memory device would accommodate the increasing threshold voltage levels, before an erase operation would need to be performed to remove all charge from the affected memory cells, as described in more detail herein below.

Figure 2:
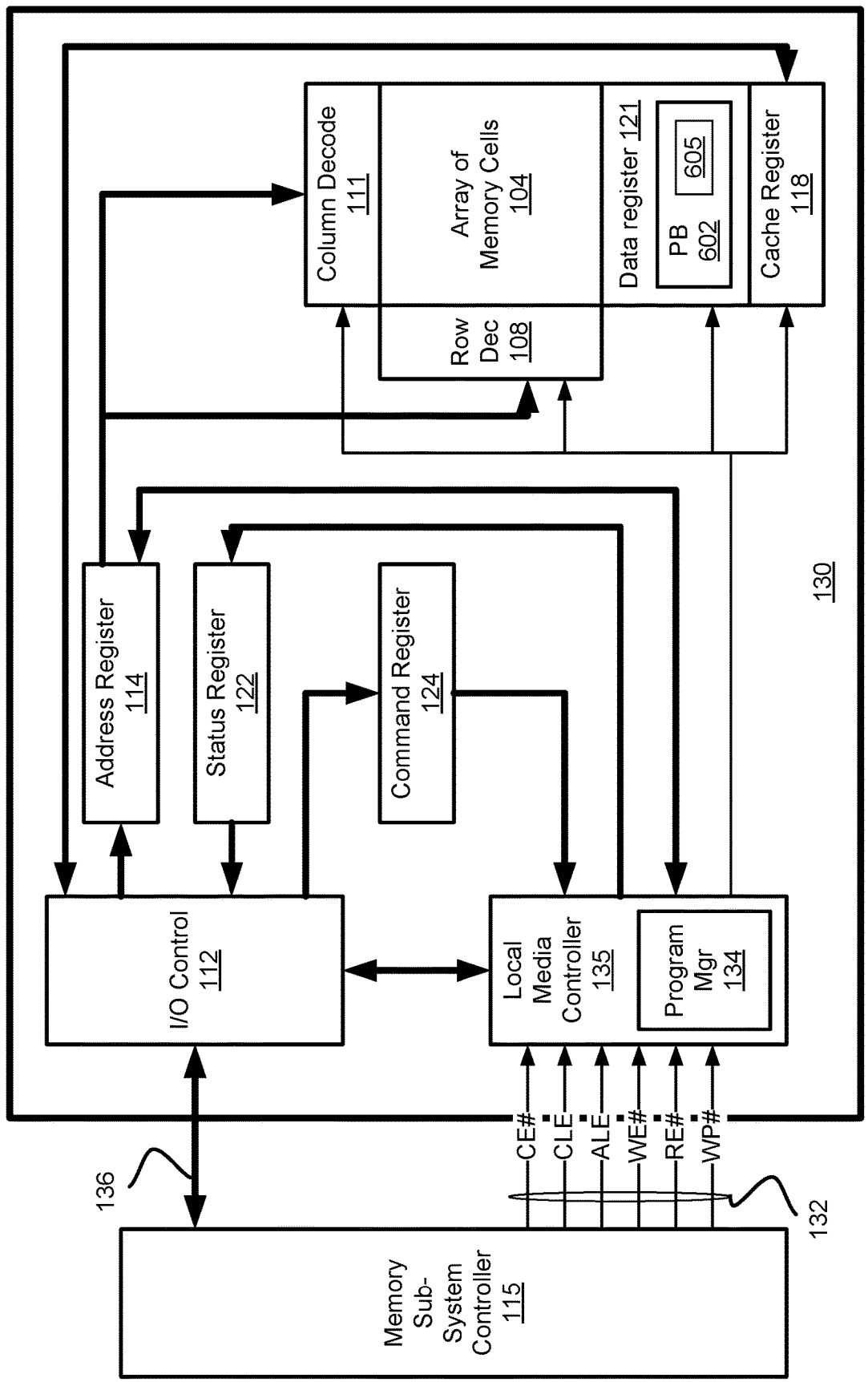
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 104 are capable of being programmed to one of at least two target data states.

Row decode circuitry 108 and column decode circuitry 111 are provided to decode address signals. Address signals are received and decoded to access the array of memory cells 204. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 108 and column decode circuitry 111 to control the row decode circuitry 108 and column decode circuitry 111 in response to the addresses. In one embodiment, local media controller 135 includes programming manager 134, which can implement the memory programming operations with respect to memory device 130, as described herein.

The local media controller 135 is also in communication with a cache register 218. Cache register 118 latches data, either incoming or outgoing, as directed by the local media controller 135 to temporarily store data while the array of memory cells 104 is busy writing or reading, respectively, other data. During a programming operation (e.g., a write operation), data may be passed from the cache register 118 to the data register 121 for transfer to the array of memory cells 204; then new data may be latched in the cache register 118 from the I/O control circuitry 212. During a read operation, data may be passed from the cache register 118 to the I/O control circuitry 112 for output to the memory sub-system controller 115; then new data may be passed from the data register 121 to the cache register 218. The cache register 118 and/or the data register 121 may form (e.g., may form a portion of) a page buffer 602 of the memory device 130. A page buffer may further include sensing devices (not shown in FIG. 2) to sense a data state of a memory cell of the array of memory cells 204, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 112 and may then be written into command register 224. The addresses may be received over input/output (I/O) pins [7:0] of I/O bus 136 at I/O control circuitry 112 and may then be written into address register 214. The data may be received over input/output (I/O) pins [7:0] for an 8-bit device or input/output (I/O) pins [15:0] for a 16-bit device at I/O control circuitry 112 and then may be written into cache register 218. The data may be subsequently written into data register 121 for programming the array of memory cells 204.

In an embodiment, cache register 118 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

One or more memory devices of the memory sub-system 100 can be represented, e.g., by NAND memory devices that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a conductive bitline (BL), which can be shared by multiple memory cells. A memory device can include an array or memory cells that are connected to a plurality of wordlines (WL) and a plurality of bitlines (BL), as schematically illustrated by FIG. 4. A memory device can further include circuitry for selectively coupling WLs and BLs to voltage sources providing control gate and source-drain signals, which is omitted from FIG. 4 for clarity and conciseness.

Figure 3B:
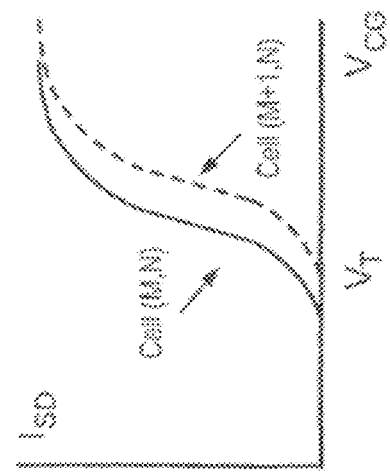
FIG. 3B schematically illustrates schematically dependence of the source-drain current on the control gate voltage for two memory cells.

Referring again to FIG. 3A, memory cells 302 and 304 can be connected to the same bitline N and two different conductive wordlines, M and M+1, respectively. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG}<V_T$, the source-drain electric current can be low, but can increase substantially once the control gate voltage has exceeded the threshold voltage, $V_{CG}>V_T$. Transistors of the same memory device can be characterized by a distribution of their threshold voltages, $P(V_T)=dW/dV_T$, so that $dW=P(V_T)dV_T$ represents the probability that any given transistor has its threshold voltage within the interval $[V_T, V_T+dV_T]$. For example, FIG. 3B illustrates schematically dependence of the source-drain current $I_{SD}$ on the control gate voltage for two memory cells, e.g. memory cell 302 (solid line) and memory cell 304 (dashed line), having different threshold control gate voltages.

Figure 3A:
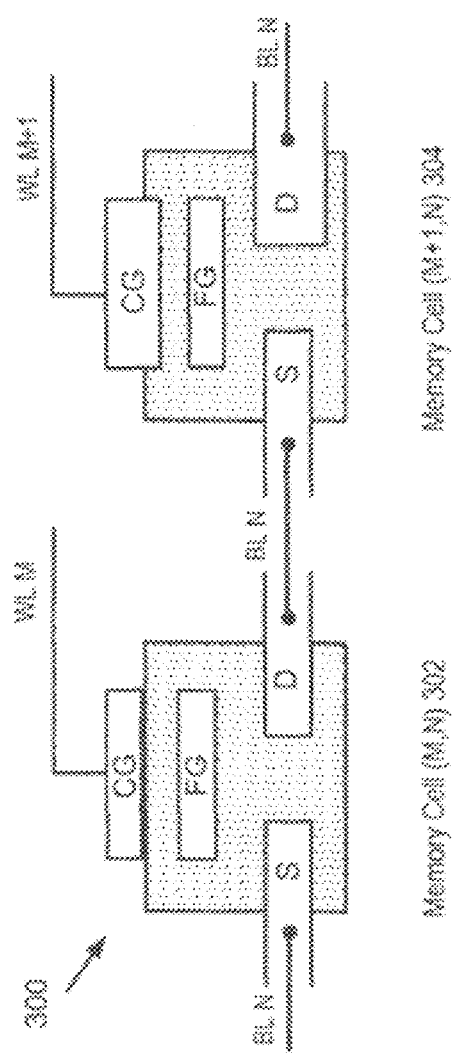
FIG. 3A schematically illustrates a set of memory cells as arranged in a memory device.
Figure 4:
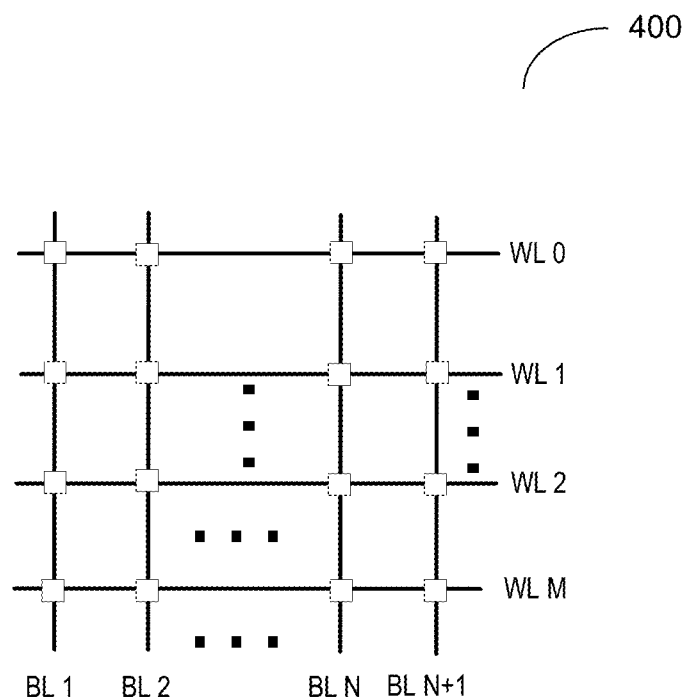
FIG. 4 schematically illustrates an example memory array.

To make a memory cell non-volatile, the cell can be further equipped with a conducting island—a charge storage node—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the charge storage node can receive an electric charge Q, which can be permanently stored thereon even after the power to the memory cell—and, consequently, the source-drain current—is ceased. The charge Q can affect the distribution of threshold voltages $P(V_T, Q)$. Generally, the presence of the electric charge Q shifts the distribution of threshold voltages towards higher voltages, compared with the distribution $P(V_T)$ for an uncharged charge storage node. This happens because a stronger positive control gate voltage $V_{CG}$ can be needed to overcome a negative potential of the charge storage node charge Q. If any charge of a sequence $Q_k$ of charges with $1 \le k \le 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N-1$ valley margins.

Figure 3C:
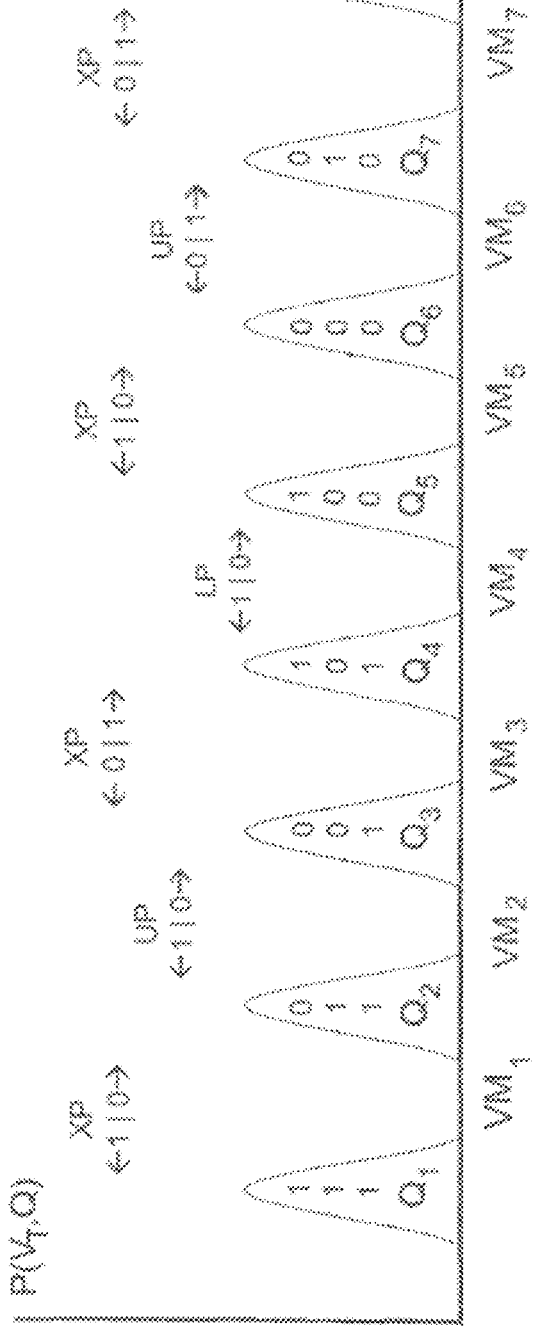
FIG. 3C schematically illustrates an example distribution of threshold control gate voltages for a memory cell.

FIG. 3C illustrates schematically a distribution of threshold control gate voltages for a memory cell capable of storing three bits of data by programming the memory cell into at least eight charge states that differ by the amount of charge on the cell's charge storage node. FIG. 3C shows distributions of threshold voltages $P(V_T, Q_k)$ for $2^N=8$ different charge states of a tri-level cell (TLC) separated with $2^3-1=7$ valley margins $VM_k$. Accordingly, a memory cell programmed into a charge state k-th (i.e., having the charge $Q_k$ deposited on its charge storage node) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

Memory devices can be classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In general, the operations described herein can be applied to memory devices having N-bit memory cells, where N>1.

For example, a TLC can be capable of being in one of eight charging states $Q_k$ (where the first state is an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 215.

As noted herein above, the memory controller 215 can program a state of the memory cell and then read can read this state by comparing a read threshold voltage $V_T$ of the memory cell against one or more read level thresholds. The read operation can be performed after a memory cell is placed in one of its charged states by a previous programming operation, which can include one or more programming passes. Each programming pass would apply appropriate programming voltages to a given wordline in order place appropriate charges on the charge storage nodes of the memory cells that are connected to the wordline.

A programming operation involves a sequence of programming voltage pulses that are applied to a selected (target) wordline (i.e., the wordline that is electrically coupled to the target memory cells). Referring again to FIG. 3A, the source (S) and drain (D) electrodes of a memory cell can be connected to a conductive bitline shared by multiple memory cells. A programming operation would apply a sequence of programming voltage pulses to the control gate (CG) via a corresponding wordline (WL). Each programming voltage pulse would induce an electric field that would pull the electrons onto the charge storage node. After each programming pulse is applied to the selected wordline, a verify operation can be performed by reading the memory cell in order to determine whether the threshold voltage $V_T$ of the memory cell has reached a desired value (voltage verify level). If the threshold voltage $V_T$ of the memory cell has reached the verify voltage associated with the desired state, the bitline to which the memory cell is connected can be biased at the program inhibit voltage, thus inhibiting the memory cells that are coupled to the bitline from being further programmed, i.e., to prevent the threshold voltate $V_T$ of the memory cells from shifting further upward in response to subsequent programming pulses applied to the selected wordline.

Figure 5:
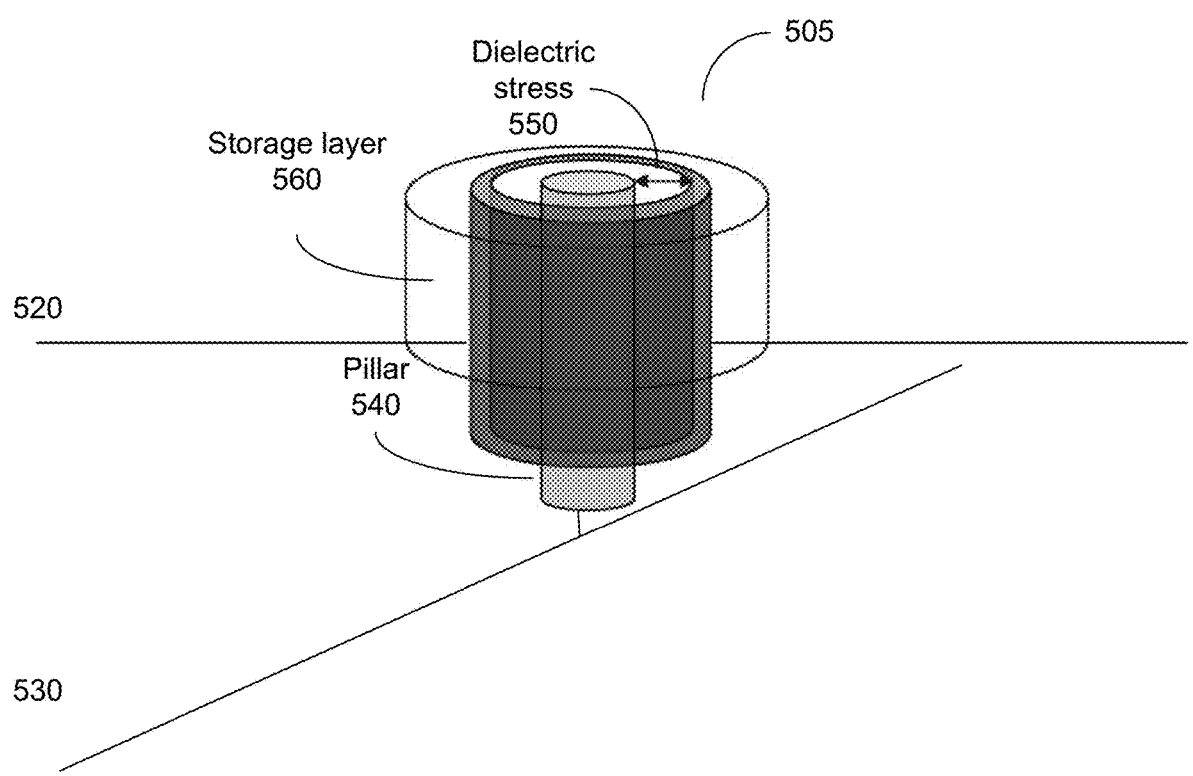
FIG. 5 schematically illustrates an example memory device operating in accordance with aspects of the present disclosure.

FIG. 5 schematically illustrates an example memory device operating in accordance with aspects of the present disclosure. As shown in FIG. 5, an example memory device can include a memory cell string comprising multiple memory cells 505 sharing a common pillar 540, dielectric layer 550, and storage layer 560. Each memory cell 505 can be electrically coupled to a corresponding wordline 520. A select gate (not shown in FIG. 5) can control coupling of the pillar 540 to a corresponding bitline 530.

Figure 6:
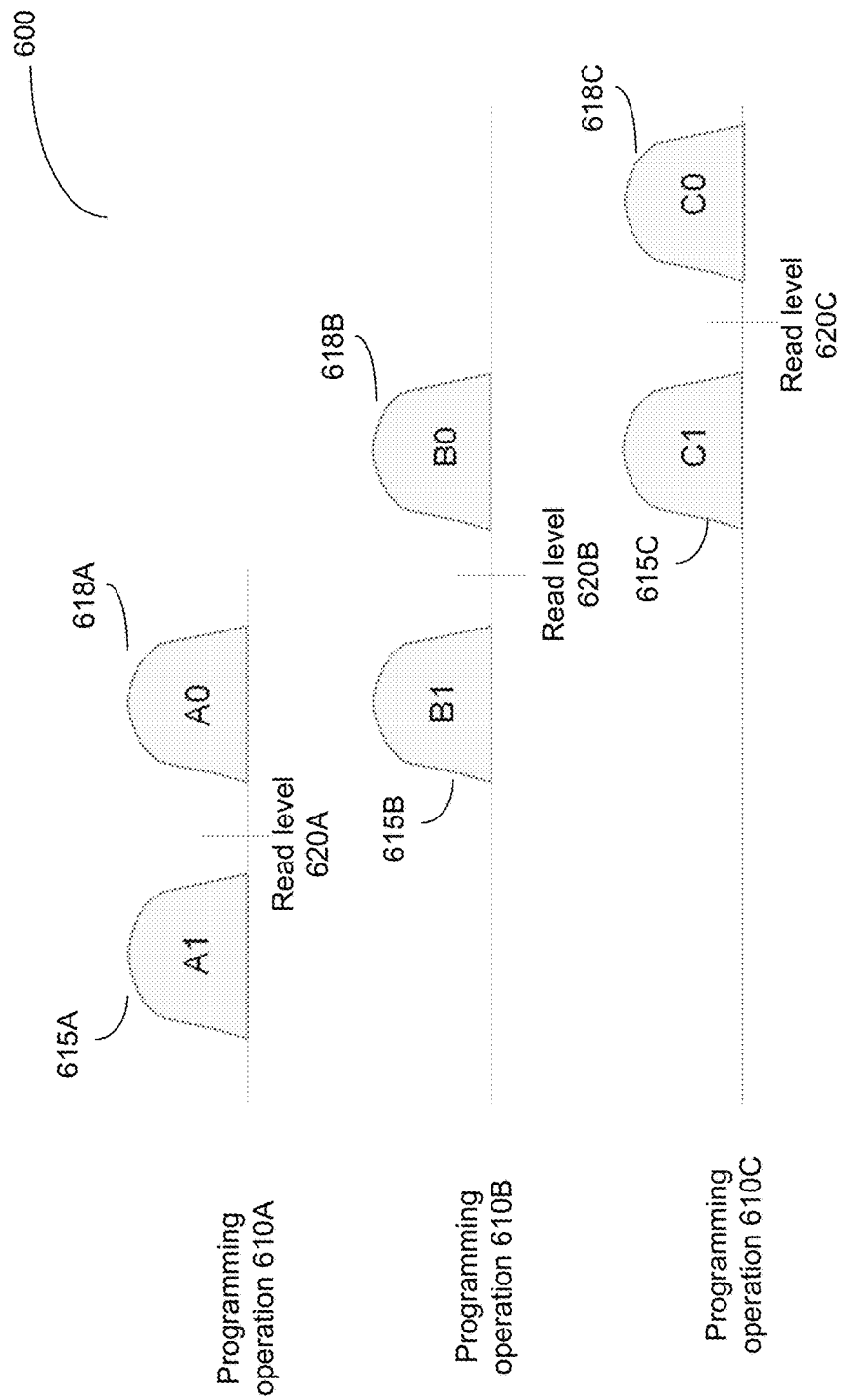
FIG. 6 schematically illustrates example threshold voltage distributions that are created by sequentially performed direct overwrite operations with respect to a portion of a memory device, in accordance with aspects of the present disclosure.

As noted herein above, direct overwrite operations can be performed without intervening erase operations, in order to improve the efficiency and reduce latency. FIG. 6 schematically illustrates example threshold voltage distributions that are created by sequentially performed direct overwrite operations with respect to a portion of a memory device, in accordance with aspects of the present disclosure. In various illustrative examples, the portion of the memory device may be represented by a block or a sub-block of memory cells.

As shown in FIG. 6, programming operations 610A-610C are sequentially performed on the memory array 600 in response to receiving a series of programming commands with respect to the same location of the memory array. Accordingly, the programming operation 610A charges the selected memory cells to the read level 620A by creating the voltage distributions 616A and 618A corresponding to two charge states (e.g., "1" and "0," respectively) of the memory cells. The next programming operation (610B) charges the selected memory cells to the read level 620B by creating the voltage distributions 616B and 618B corresponding to the new charge states (e.g., "1" and "0," respectively) of the memory cells. The third programming operation (610C) charges the selected memory cells to the read level 620C by creating the voltage distributions 616C and 616C corresponding to new charge states (e.g., "1" and "0," respectively) of the memory cells.

This way, each subsequent programing operation 610 can charge the selected memory cells to a higher threshold voltage value as compared to the previous programing operation, thus creating new threshold voltage distributions 616 and 618 around a higher threshold voltage value 620. Such an approach effectively eliminates the need to perform the intervening erase operations with respect to the previously created threshold voltage distributions, since the threshold voltage value which would be utilized by a subsequent read operation would be above the highest possible value of the previously created voltage distributions.

Thus, for performing a read operation, the memory device controller would need to know the parameters of the voltage distributions that have been created by the last programming operation, i.e., the position of the valley that divides the distributions corresponding to "1" and "0" logical levels. This position can be encoded, e.g., by an integer indicating the serial number of the last programming operation within the direct overwrite sequence (e.g., 0, 1, or 2 for the sequences including three programming operations before an erase operation, as illustrated by FIG. 6).

In some implementations, the additional metadata encoding the serial number of the last programming operation within the direct overwrite sequence can be stored in the page buffer latches of the memory device, which in conventional implementations are employed for holding the data to be written to the memory device. In the illustrative example of FIG. 6, the memory device is equipped with page buffer latches that are capable of holding three bits for each memory cell. Since only one bit per cell is being programmed in the example sequence of programming operations of FIG. 6, the remaining two bits of the page buffer latches 602 can be employed for storing the serial number 605 of the last programming operation within the direct overwrite sequence, as schematically illustrated by FIG. 2. Accordingly, in order to perform a subsequent read operation, the memory device controller would retrieve the value stored in the designated bits of the page buffer latches associated with the memory cell(s) that are being read (e.g., two out of the three page buffer latch bits in the illustrative example of FIG. 6), and would utilize the retrieved value for determining the position of the valley that divides the distributions corresponding to "1" and "0" logical levels. In an illustrative example, the controller may multiply the retrieved value of the serial number of the last programming operation within the direct overwrite sequence by the width of the threshold voltage distributions created by each programming operations, and then would add the resulting value to the offset of the first read level (i.e., read level 620A), thus arriving at the read level 620A (for the first operation in the direct overwrite sequence), real level 620B (for the second operation in the direct overwrite sequence), or read level 620C (for the third operation in the direct overwrite sequence).

As noted herein above, the direct overwrite operations can be repeated several times, e.g., in response to sequentially receiving data items to be stored at the same location of the memory device, as long as the storage media and the electric circuitry of the memory device would accommodate the increasing threshold voltage levels 620. While the illustrative example of FIG. 1 shows three sequential programming operations 610A-610B operating with respective threshold voltage levels 620A-620C, other implementations can accommodate fewer or higher numbers of sequentially performed programming operations before an erase operation would need to be performed in order to erase all the previously created threshold voltage distributions.

Thus, the number of programming operations that could be sequentially performed before an erase operation would be needed is determined by the available threshold voltage range and thus number of threshold voltage distributions that can be accommodated within the available threshold voltage range. Accordingly, in order to maximize the number of programing operations within a single series of direct overwrite operations, the width of the programing voltage distributions 616A-616C and 618A-618C should be minimized to the smallest practically achievable value. As noted herein above, various programming techniques can be employed to implement the above-described direct overwrite operations, provided that the desired distribution width can be achieved.

Figure 7:
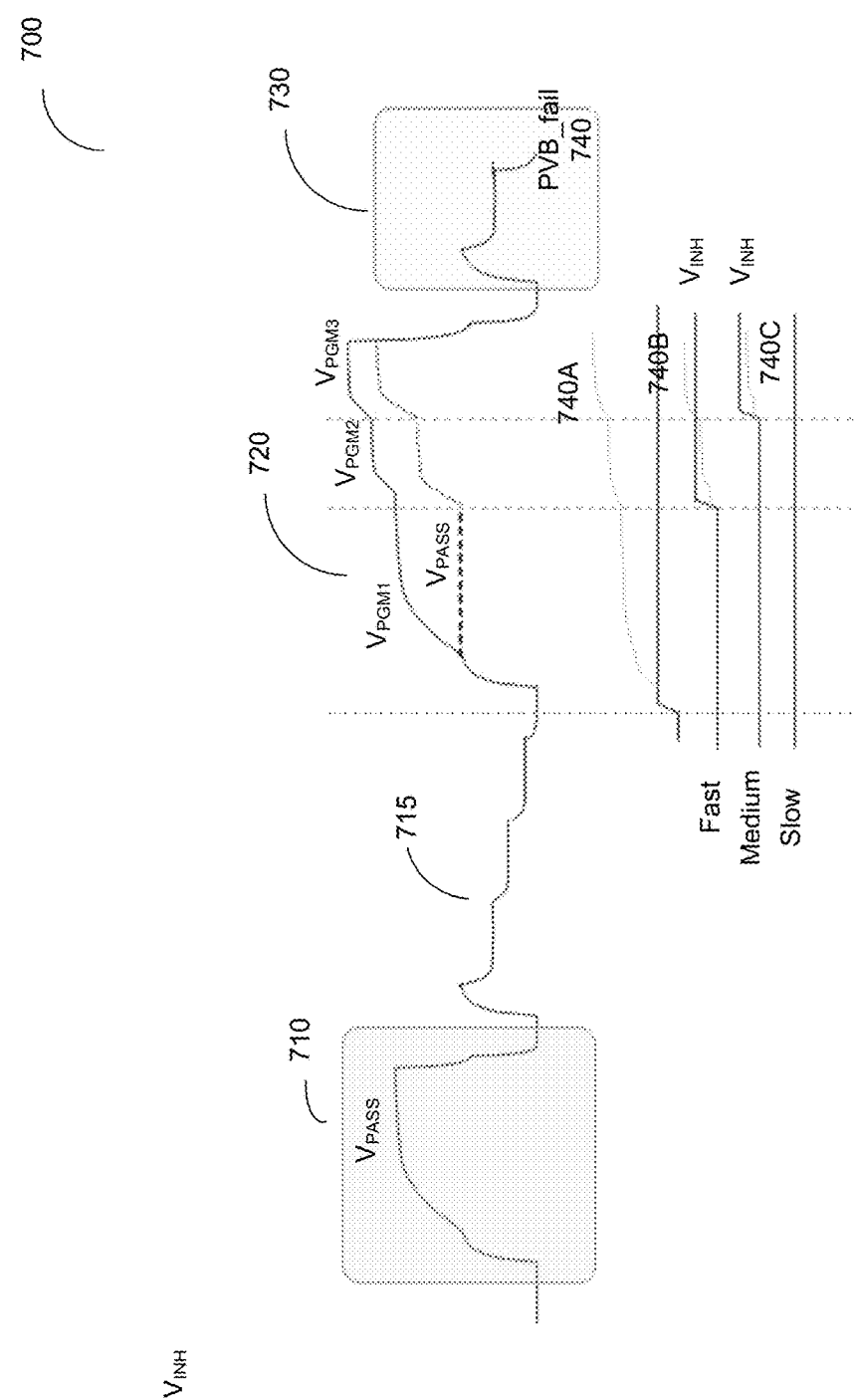
FIG. 7 illustrates example voltage waveforms applied to portions of a memory array during execution of programming operations by systems and methods of the present disclosure.
Figure 8:
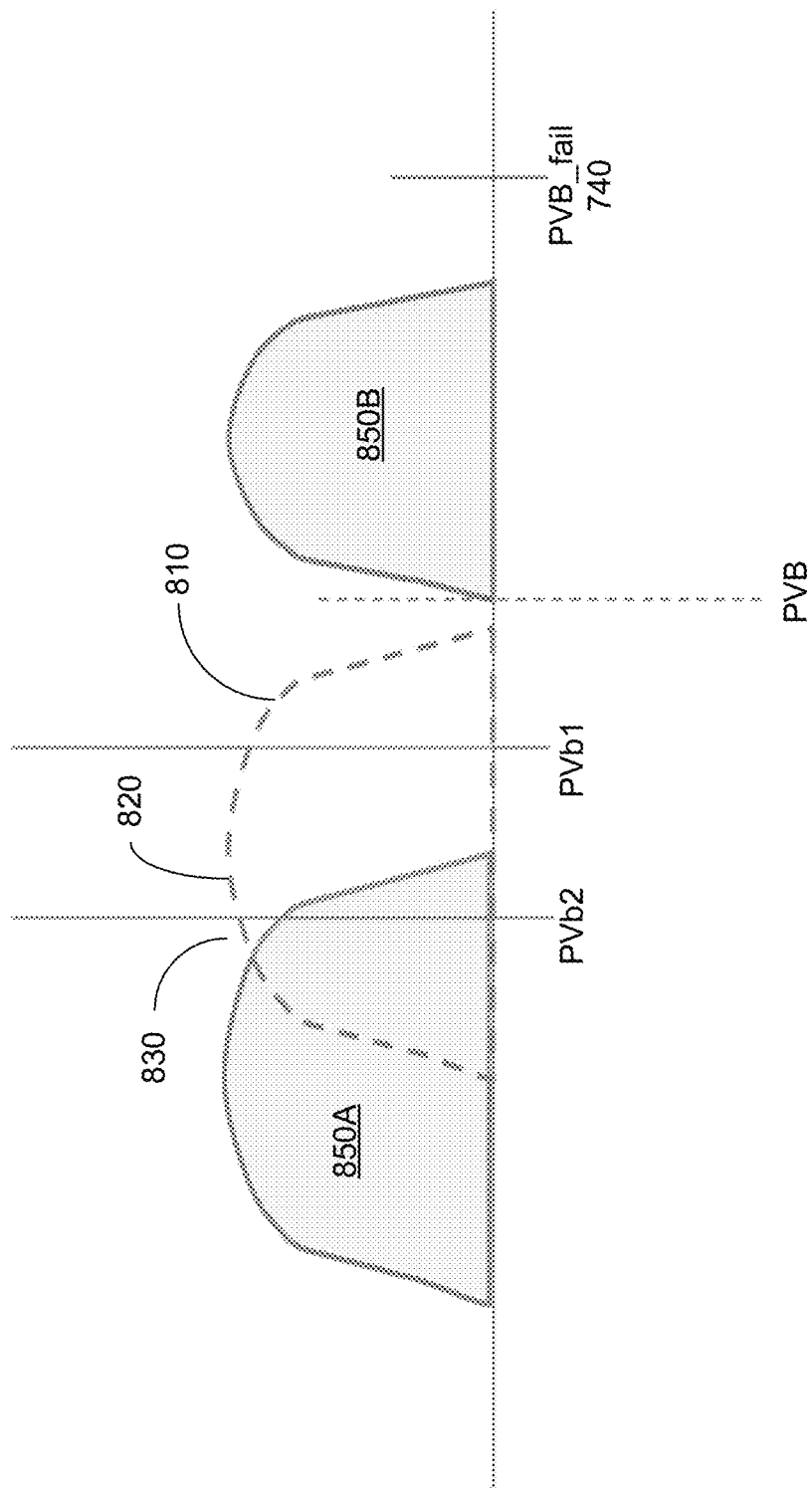
FIG. 8 schematically illustrates threshold voltage distributions that are created by programming operations performed with respect to a portion of a memory device, in accordance with aspects of the present disclosure.

In some implementations, a programming operation may involve selectively inhibiting bitlines based on the charge level of the corresponding memory cells, while applying one or more programing pulses to the selected wordline, as schematically illustrated by FIG. 7. Accordingly, a programming operation 700 may involve the initial stage 710 of applying a pass voltage level (e.g., $V_{PASS}$) to a plurality of wordlines of the memory device, followed by the verification stage 715, which can involve one or more read operations to measure the resulting threshold voltage levels, thus classifying the affected memory cells into several categories, e.g., the "fast," "medium," and "slow" categories 810, 820, and 830, respectively, as shown by FIG. 8, which schematically illustrates the threshold voltage distributions before and after the programming operation 700, i.e., distributions 850A and 850B, respectively. The "fast" category would include the memory cells having the threshold voltage exceeding the high threshold voltage level $PVb_1$, the "medium" category would include the memory cells having the threshold voltage between the low threshold voltage level $PVb_2$ and the high threshold voltage level $PVb_1$, and "slow" category would include the memory cells having the threshold voltage below the low threshold voltage level $PVb_2$, where $PVb_2<PVb_1$. The terms "fast," "medium," and "slow" are only utilized for the purposes of illustrating the positions of the respective memory cells with respect to the initial and target voltage distributions 850A and 850B (i.e., "fast" memory cells are located closer to the distribution 850B, while "slow" memory cell are located closer to the distribution 850A). While the illustrative example of FIG. 7 classifies all memory cells into three categories based on reaching one of the two predefined threshold voltage levels, in various other implementations, different numbers of categories can be utilized.

Following the verification stage 715, a series of programming pulses 720 at increasing voltage levels $V_{PGM1}<V_{PGM2}<V_{PGM3}$ is applied to the selected (target) wordline that is electrically coupled to the memory cells to be programmed, while the unselected wordlines stay at the pass voltage level $V_{PASS}$. During the programing pulses 720, the bitlines are selectively inhibited by applying the inhibit voltage level $V_{INH}$ to the bitlines based on their threshold voltage level classification. Accordingly, the inhibit voltage level is applied to "fast" bitlines (i.e., bitlines coupled to the memory cells having the threshold voltage exceeding the high threshold voltage level $PVb_1$) during the second programming pulse at the voltage level $V_{PGM2}$ and the inhibit voltage level is applied to "medium" bitlines (i.e., bitlines coupled to the memory cells having the threshold voltage between the low threshold voltage level $PVb_2$ and the high threshold voltage level $PVb_1$) during the third programming pulse at the voltage level $V_{PGM3}$. Once the inhibit voltage level is applied to a certain bitline, the voltage level is held for that bitline until the end of the series of programming pulses 720. Applying the inhibit voltage to the bitlines results in the respective pillar potentials 740A-740C.

The programming stage 720 is followed by the verification stage 730 which can involve one or more read operations to measure the resulting threshold voltage levels, which allows identifying the failing memory cells having their threshold voltage level PVB_fail 740 outside of the range of the threshold voltage distribution 820B that has been created by the programming operation 700, as schematically illustrated by FIG. 8.

Thus, selectively, based on the memory cell position with respect to the target threshold voltage level, inhibiting the bitlines during the programming voltage pulses allows to efficiently produce the target threshold voltage distribution having the desired parameters (e.g., the distribution width) that would maximize the number of programing operations which can be performed within a single series of direct overwrite operations.

While the illustrative example of FIG. 7 utilizes three increasing voltage levels $V_{PGM1}<V_{PGM2}<V_{PGM3}$ during the programming operation 720 based on classifying all memory cells into three categories, in various other implementations, different numbers of increasing voltage levels can be utilized.

In other implementations, various other memory cell programming techniques can be utilized for implementing the direct overwrite methods described herein.

Figure 9:
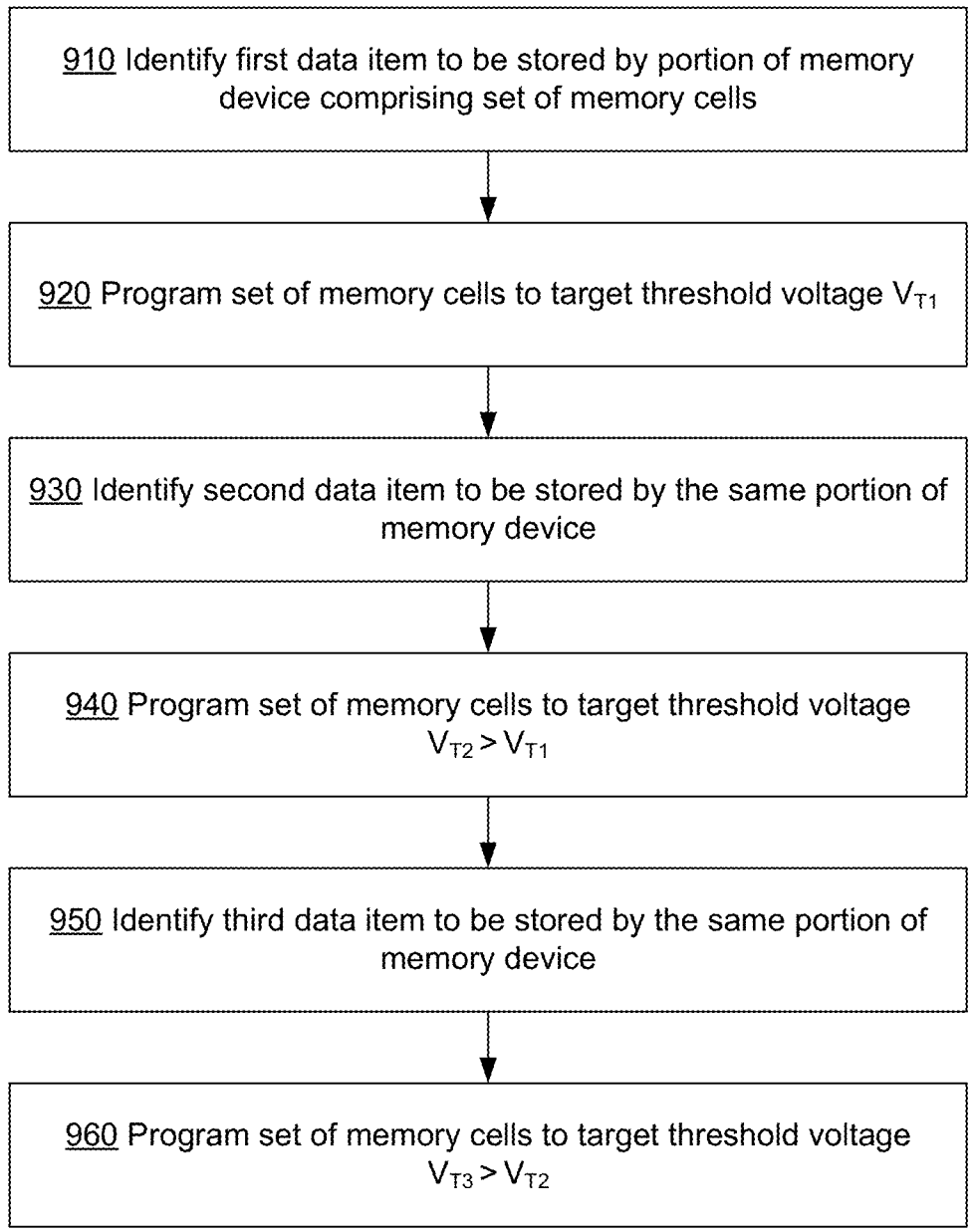
FIG. 9 is a flow diagram of an example method of performing memory programming operations in the overwrite mode, in accordance with embodiments of the present disclosure.

FIG. 9 is a flow diagram of an example method of performing memory programming operations in the overwrite mode, in accordance with embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the memory sub-system controller 115 and/or the local media controller 135 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 910, the controller implementing the method identifies a data item to be stored by a portion of the memory device. In an illustrative example, the program manager 134 implemented by the local media controller 135 of FIG. 1 can receive, from the memory interface 113 of the memory sub-system controller 115, a request to perform a memory access operation (e.g., a write operation) on a specified portion of the memory device. The data item to be written to the memory device is received by the I/O data path 112 of FIG. 2 and is routed, by the controller, to the memory device. Accordingly, in one embodiment, the memory access operation involves a programming operation to program the memory cells of the portion of the memory device to a specified logical level. In one embodiment, the controller may identify the memory cells by specifying the wordline and one or more bitlines, as described in more detail herein above.

At operation 920, the controller causes the first memory programming operation to be performed to program the identified memory cells to the first target threshold voltage $V_{T1}$. In an illustrative example, the programming operation may involve applying one or more programming pulses to the selected wordlines, followed by a program verify operation in order to ascertain that the memory cells have reached the desired charge level, as described in more detail herein above.

At operation 930, the controller implementing the method identifies the next data item to be stored by the same portion of the memory device.

At operation 940, the controller causes the second memory programming operation to be performed to program the identified memory cells to the second target threshold voltage $V_{T2}$ that exceeds the first target threshold voltage $V_{T1}$, thus effectively forming a new threshold voltage distribution and avoiding the need of performing an intervening erase operation. In an illustrative example, the programming operation may involve selectively inhibiting bitlines based on the charge level of the corresponding memory cells, while applying one or more programing pulses to the selected wordline, as described in more detail herein above.

In some implementations, the controller may, after each programming operation, store metadata encoding the serial number of the last programming operation within the direct overwrite sequence. The metadata may be stored, e.g., in the page buffer latches of the memory device, as described in more detail herein above.

At operation 950, the controller implementing the method identifies the next data item to be stored by the same portion of the memory device.

At operation 960, the controller causes the third memory programming operation to be performed to program the identified memory cells to the second target threshold voltage $V_{T3}$ that exceeds the first target threshold voltage $V_{T2}$, thus effectively forming a new threshold voltage distribution and avoiding the need of performing an intervening erase operation. In an illustrative example, the programming operation may involve selectively inhibiting bitlines based on the charge level of the corresponding memory cells, while applying one or more programing pulses to the selected wordline, as described in more detail herein above.

Figure 10:
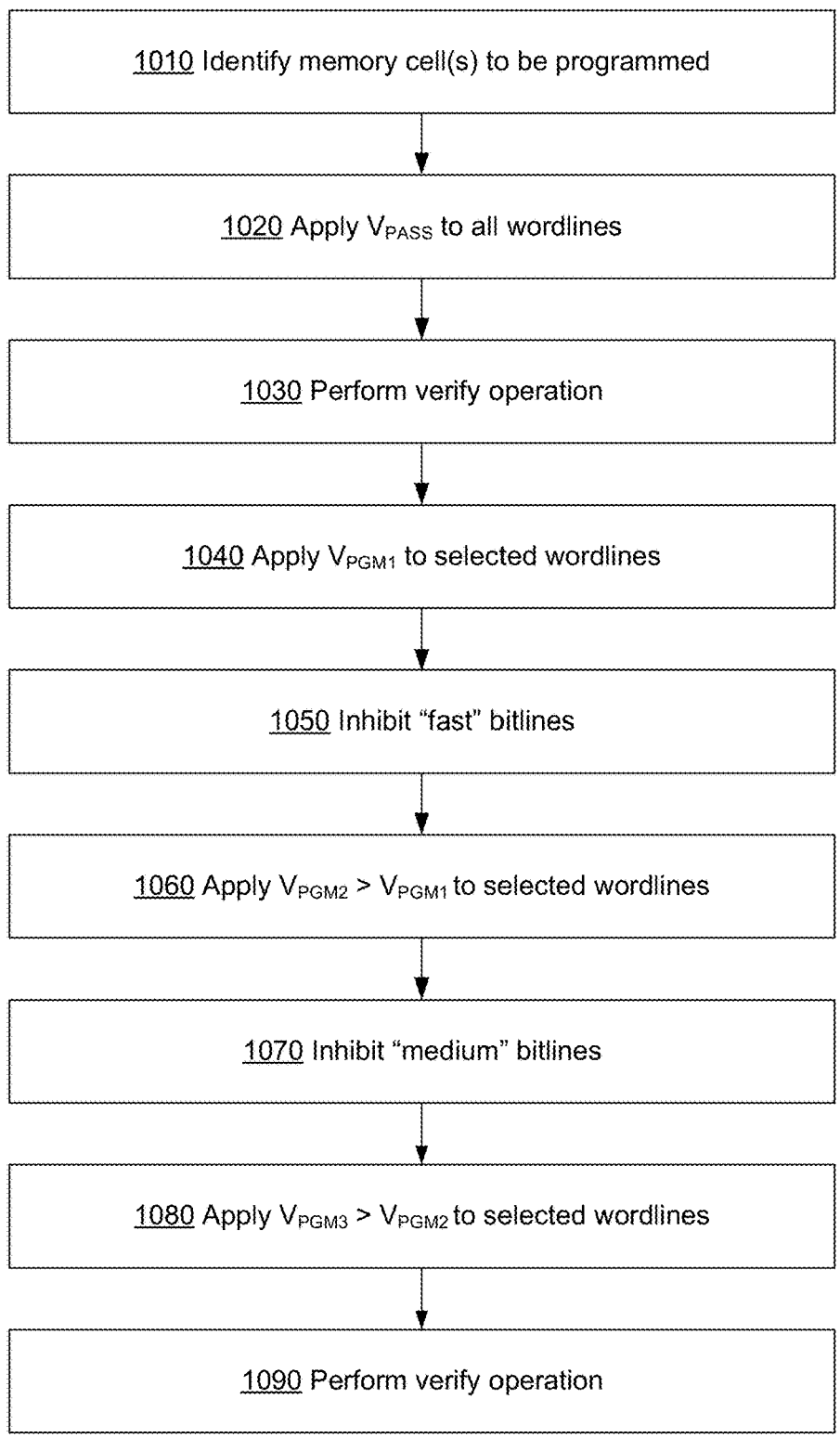
FIG. 10 is a flow diagram of an example method of performing memory programming operations in the overwrite mode, in accordance with embodiments of the present disclosure.

FIG. 10 is a flow diagram of an example method of performing memory programming operations, in accordance with embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the memory sub-system controller 115 and/or the local media controller 135 of FIG. 1. In some implementations, the method 1000 can be employed for programming memory cells in the overwrite mode, as described herein above with references to FIG. 9. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 1010, the controller implementing the method identifies one or more a memory cells to be programmed. In an illustrative example, the program manager 134 implemented by the local media controller 135 of FIG. 1 can receive, from the memory interface 113 of the memory sub-system controller 115, a request to perform a memory access operation on a specified memory device. In one embodiment, the memory access operation involves a programming operation to program the identified memory cells to a specified logical level. In one embodiment, the request to perform the memory access operations may identify one or more memory cells by specifying the wordline and one or more bitlines, as described in more detail herein above.

At operation 1020, the controller causes a pass voltage level to be applied to the selected wordlines of the memory device.

At operation 1030, the controller causes one or more program verify operations to be performed by reading the memory cells to which the pass voltage level has been applied, in order to classify the memory cells into several categories based on the memory cells reaching certain predefined threshold voltage levels, as described in more detail herein above.

At operation 1040, the controller causes the first programming voltage level $V_{PGM1}$ to be applied to the selected (target) wordlines of the memory device, as described in more detail herein above.

At operation 1050, the controller causes the inhibit voltage level $V_{INH}$ to be applied to the "fast" bitlines (i.e., bitlines coupled to the memory cells having the threshold voltage exceeding the high threshold voltage level $PVb_1$), as described in more detail herein above.

At operation 1060, the controller causes the first programming voltage level $V_{PGM2}>V_{PGM1}$ to be applied to the selected (target) wordlines of the memory device, as described in more detail herein above.

At operation 1070, the controller causes the inhibit voltage level $V_{INH}$ to be applied to the "medium" bitlines (i.e., bitlines coupled to the memory cells having the threshold voltage exceeding between the low threshold voltage level $PVb_2$ and the high threshold voltage level $PVb_1$), as described in more detail herein above.

At operation 1060, the controller causes the first programming voltage level $V_{PGM3}>V_{PGM2}$ to be applied to the selected (target) wordlines of the memory device, as described in more detail herein above.

At operation 1060, the controller causes a program verify operation to be performed by reading one or more memory cells to which the programming pulse has been applied, in order to determine whether the threshold voltage $V_T$ of the memory cells has reached a desired value, as described in more detail herein above.

Figure 11:
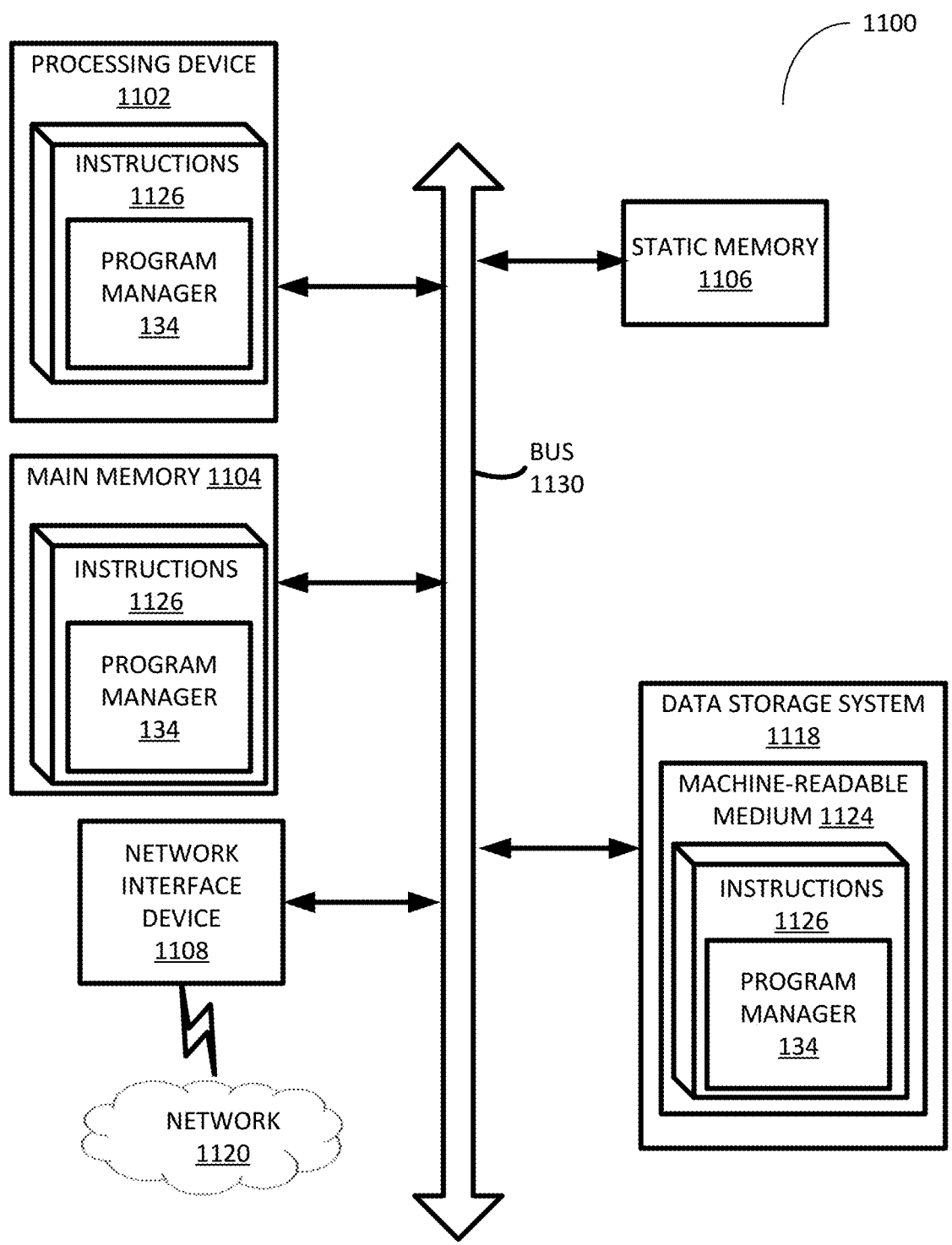
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to programming manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1114 (also known as a computer-readable medium, such as a non-transitory computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to programming manager 134 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device, comprising:
   a memory array comprising a plurality of memory cells electrically coupled to a plurality of wordlines and a plurality of bitlines; and
   a controller coupled to the memory array, the controller configured to perform operations comprising:
      responsive to identifying a first data item to be stored by a portion of the memory array, causing a first memory programming operation to be performed to program, to a first target threshold voltage, a set of memory cells comprised by the portion of the memory array; and
      responsive to identifying a second data item to be stored by the portion of the memory array, causing a second memory programming operation to be performed to program the set of memory cells to a second target threshold voltage exceeding the first target threshold voltage, wherein no memory erase operations with respect to the set of memory cells are performed between the first memory programming operation and the second memory programming operation.

2. The memory device of claim 1, wherein the operations further comprise:
   responsive to identifying a third data item to be stored by the portion of the memory array, causing a third memory programming operation to be performed to program the set of memory cells to a third target threshold voltage exceeding the second target threshold voltage.

3. The memory device of claim 1, wherein the operations further comprise:
   responsive to causing the second memory programming operation to be performed, storing, in a page buffer associated with the set of memory cells, a value reflecting a sequential number of the second memory programming operations performed with respect to the set of memory cells within a current sequence of direct overwrite operation.

4. The memory device of claim 1, wherein causing the second memory programming operation to be performed further comprises:
   causing a pass voltage level to be applied to a plurality of wordlines of the memory array;
   performing one or more program verify operations to compare threshold voltage levels of the set of memory cells to at least one predefined threshold voltage level, thus classifying the set of memory cells into two or more categories;
   causing a first programming voltage level to be applied to selected wordlines of the memory array, wherein the first programing voltage level exceeds the pass voltage level;
   causing an inhibit voltage level to be applied to one or more bitlines associated with memory cells of a first category of the two or more categories;
   causing a second programming voltage level to be applied to selected wordlines of the memory array, wherein the second programming voltage level exceeds the first programing voltage level.

5. The memory device of claim 4, wherein the operations further comprise:
   causing the inhibit voltage level to be applied to one or more bitlines associated with memory cells of a second category of the two or more categories;
   causing a third programming voltage level to be applied to selected wordlines of the memory array, wherein the third programing voltage level exceeds the second programing voltage level.

6. The memory device of claim 4, wherein the operations further comprise:
   performing a program verify operation.

7. The memory device of claim 1, wherein the set of memory cells is a block of the memory array.

8. A computer-readable non-transitory storage medium comprising executable instructions that, when executed by a controller managing a memory array comprising a plurality of memory cells, cause the controller to perform operations, comprising:
   responsive to identifying a first data item to be stored by a portion of the memory array, causing a first memory programming operation to be performed to program, to a first target threshold voltage, a set of memory cells comprised by the portion of the memory array; and
   responsive to identifying a second data item to be stored by the portion of the memory array, causing a second memory programming operation to be performed to program the set of memory cells to a second target threshold voltage exceeding the first target threshold voltage, wherein no memory erase operations with respect to the set of memory cells are performed between the first memory programming operation and the second memory programming operation.

9. The computer-readable non-transitory storage medium of claim 8, wherein the operations further comprise:
   responsive to identifying a third data item to be stored by the portion of the memory array, causing a third memory programming operation to be performed to program the set of memory cells to a third target threshold voltage exceeding the second target threshold voltage.

10. The computer-readable non-transitory storage medium of claim 8, wherein the operations further comprise:
    responsive to causing the second memory programming operation to be performed, storing, in a page buffer associated with the set of memory cells, a value reflecting a sequential number of the second memory programming operations performed with respect to the set of memory cells within a current sequence of direct overwrite operation.

11. The computer-readable non-transitory storage medium of claim 8, wherein causing the second memory programming operation to be performed further comprises:

causing a pass voltage level to be applied to a plurality of wordlines of the memory array;

performing one or more program verify operations to compare threshold voltage levels of the set of memory cells to at least one predefined threshold voltage level, thus classifying the set of memory cells into two or more categories;

causing a first programming voltage level to be applied to selected wordlines of the memory array, wherein the first programming voltage level exceeds the pass voltage level;

causing an inhibit voltage level to be applied to one or more bitlines associated with memory cells of a first category of the two or more categories;

causing a second programming voltage level to be applied to selected wordlines of the memory array, wherein the second programing voltage level exceeds the first programing voltage level.

12. The computer-readable non-transitory storage medium of claim 11, wherein the operations further comprise:

causing the inhibit voltage level to be applied to one or more bitlines associated with memory cells of a second category of the two or more categories;

causing a third programming voltage level to be applied to selected wordlines of the memory array, wherein the third programing voltage level exceeds the second programing voltage level.

13. The computer-readable non-transitory storage medium of claim 11, wherein the operations further comprise:

performing a program verify operation.

14. A method, comprising:

responsive to identifying, by a controller managing a memory array, a first data item to be stored by a portion of the memory array, causing a first memory programming operation to be performed to program, to a first target threshold voltage, a set of memory cells comprised by the portion of the memory array; and responsive to identifying a second data item to be stored by the portion of the memory array, causing a second memory programming operation to be performed to program the set of memory cells to a second target threshold voltage exceeding the first target threshold voltage, wherein no memory erase operations with respect to the set of memory cells are performed between the first memory programming operation and the second memory programming operation.

15. The method of claim 14, further comprising:

responsive to identifying a third data item to be stored by the portion of the memory array, causing a third memory programming operation to be performed to program the set of memory cells to a third target threshold voltage exceeding the second target threshold voltage.

16. The method of claim 14, further comprising:

responsive to causing the second memory programming operation to be performed, storing, in a page buffer associated with the set of memory cells, a value reflecting a sequential number of the second memory programming operations performed with respect to the set of memory cells within a current sequence of direct overwrite operation.

17. The method of claim 14, wherein causing the second memory programming operation to be performed further comprises:

causing a pass voltage level to be applied to a plurality of wordlines of the memory array;

performing one or more program verify operations to compare threshold voltage levels of the set of memory cells to at least one predefined threshold voltage level, thus classifying the set of memory cells into two or more categories;

causing a first programming voltage level to be applied to selected wordlines of the memory array, wherein the first programing voltage level exceeds the pass voltage level;

causing an inhibit voltage level to be applied to one or more bitlines associated with memory cells of a first category of the two or more categories;

causing a second programming voltage level to be applied to selected wordlines of the memory array, wherein the second programing voltage level exceeds the first programing voltage level.

\* \* \* \* \*